(12) United States Patent
Nomaru et al.

(10) Patent No.: US 7,589,332 B2
(45) Date of Patent: Sep. 15, 2009

(54) VIA-HOLE PROCESSING METHOD

(75) Inventors: Keiji Nomaru, Ota-ku (JP); Hiroshi Morikazu, Ota-ku (JP)

(73) Assignee: Disco Corporation, Tokyo (JP)

( * ) Notice: Subject to any disclaimer, the term of this patent is extended or adjusted under 35 U.S.C. 154(b) by 231 days.

(21) Appl. No.: 11/900,844

(22) Filed: Sep. 13, 2007

(65) Prior Publication Data

US 2008/0067427 A1 Mar. 20, 2008

(30) Foreign Application Priority Data

Sep. 20, 2006 (JP) ............................. 2006-254250

(51) Int. Cl.
*G21G 5/00* (2006.01)
*B23K 26/38* (2006.01)

(52) U.S. Cl. ............................ 250/492.2; 250/492.22; 219/121.75; 219/121.62

(58) Field of Classification Search ............. 250/492.1, 250/492.2, 492.22, 492.21, 492.3; 219/121.6, 219/121.61, 121.67, 121.68, 121.7, 121.71, 219/121.72, 121.73, 121.74, 121.75, 121.77
See application file for complete search history.

(56) References Cited

U.S. PATENT DOCUMENTS

| | | | | |
|---|---|---|---|---|
| 5,498,850 | A * | 3/1996 | Das | 219/121.66 |
| 5,659,656 | A * | 8/1997 | Das | 392/386 |
| 5,661,744 | A * | 8/1997 | Murakami et al. | 372/57 |
| 6,373,026 | B1 * | 4/2002 | Kurosawa et al. | 219/121.72 |
| 6,972,392 | B2 * | 12/2005 | Kurosawa et al. | 219/121.72 |
| 7,408,129 | B2 * | 8/2008 | Morikazu et al. | 219/121.75 |
| 2002/0033387 | A1 * | 3/2002 | Kurosawa et al. | 219/121.72 |
| 2003/0033387 | A1 * | 2/2003 | Adams et al. | 709/220 |
| 2005/0032261 | A1 * | 2/2005 | Okumura | 438/29 |
| 2006/0116000 | A1 * | 6/2006 | Yamamoto | 438/795 |
| 2007/0284347 | A1 * | 12/2007 | Morikazu | 219/121.71 |
| 2008/0009132 | A1 * | 1/2008 | Morikazu | 438/637 |
| 2008/0011723 | A1 * | 1/2008 | Morikazu | 219/121.68 |
| 2008/0045036 | A1 * | 2/2008 | Morikazu | 438/759 |
| 2008/0053971 | A1 * | 3/2008 | Kobayashi et al. | 219/121.61 |
| 2008/0055588 | A1 * | 3/2008 | Nomaru et al. | 356/73 |
| 2008/0061042 | A1 * | 3/2008 | Nomaru | 219/121.67 |
| 2008/0067157 | A1 * | 3/2008 | Morikazu | 219/121.71 |
| 2008/0067427 | A1 * | 3/2008 | Nomaru et al. | 250/492.2 |
| 2008/0110868 | A1 * | 5/2008 | Morikazu et al. | 219/121.67 |
| 2008/0153315 | A1 * | 6/2008 | Morikazu | 438/795 |
| 2008/0180697 | A1 * | 7/2008 | Sawabe et al. | 356/630 |
| 2008/0217301 | A1 * | 9/2008 | Nomaru et al. | 219/121.8 |
| 2008/0296275 | A1 * | 12/2008 | Oba et al. | 219/121.75 |

FOREIGN PATENT DOCUMENTS

| | | |
|---|---|---|
| JP | 2003-163 | 6/2003 |
| JP | 2003-163323 | 6/2003 |

\* cited by examiner

*Primary Examiner*—Bernard E Souw
(74) *Attorney, Agent, or Firm*—Greer, Burns & Crain, Ltd.

(57) ABSTRACT

In a via-hole formation method of forming a via-hole reaching a bonding pad, in a substrate of a wafer in which a plurality of devices are formed on a surface of the substrate and the bonding pad is formed on each of the devices, a pulse laser beam whose energy distribution is shaped into a top-hat shape is emitted to form a via-hole reaching a via-hole.

2 Claims, 9 Drawing Sheets

VIA-HOLE PROCESSING METHOD

BACKGROUND OF THE INVENTION

1. Field of the Invention

The present invention relates to a via-hole processing method of applying a pulse laser beam to the rear surface side of a substrate of a wafer to form a via-hole reaching a bonding pad, in the wafer in which a plurality of devices are formed on the front surface of the substrate and bonding pads are formed on each of the devices.

2. Description of the Related Art

In a semiconductor device fabrication process, the front surface of an almost-disklike semiconductor wafer is sectioned into a plurality of regions by lattice-like arranged division-planning lines referred to as streets. Devices such as an IC, an LSI and the like are formed on the region thus sectioned. The semiconductor wafer is cut along the streets into the regions formed with the devices, thus fabricating individual semiconductor chips.

To promote downsizing and high-performance of a device, a module structure is put into practical use in which a plurality of semiconductor chips are stacked and the bonding pads of the stacked semiconductor chips are connected. This module structure is as below. A plurality of devices are formed on the front surface of a substrate constituting part of the semiconductor wafer and bonding pads are formed on the devices. A thin hole (via-hole) is bored at a position where each of the bonding pads is formed so as to reach the bonding pad from the rear surface side of the substrate. A conductive material such as aluminum, copper or the like is buried in the via-hole so as to be connected to the bonding pad. (See e.g. Japanese Patent Laid-open No. 2003-163323).

The via-hole formed in the above-mentioned semiconductor wafer is generally bored by a drill. However, since the via-hole formed in the semiconductor wafer has a diameter of as small as 100 to 300 µm, the boring by the drill is not necessarily satisfactory in terms of productivity. In addition, since the above-mentioned bonding pad has a thickness of about 1 to 5 µm, the drill must be controlled extremely accurately in order to form a via-hole in only a substrate made of silicon forming the wafer without breakage of a bonding pad.

To eliminate the above-mentioned problem, the present applicant has proposed a wafer-boring method, as Japanese Patent Application No. 2005-249643, of applying a pulse laser beam to the rear surface side of a substrate of a wafer to efficiently form a via-hole reaching a bonding pad, in the wafer in which a plurality of devices are formed on a front surface of the substrate and a bonding pad is formed on each of the devices.

The method of forming a via-hole by irradiation of a laser beam from the rear surface of the semiconductor wafer needs to bombard the same place with a pulse laser beam at a plurality of times. In addition, it is needed to stop bombardment just before an electrode called a bonding pad formed on the front surface of the semiconductor gets a hole. However, the energy distribution of a laser beam is a Gaussian distribution in which energy is strongest at the center and it is progressively reduced as it goes to the outer circumferential portion. The wafer is most processed by the central portion of the bombarding laser beam so that a laser processing hole having uniform depth cannot be formed. Thus, there arises a problem in that the bonding pad is melt to get a hole at a position corresponding to the central portion of the laser beam.

SUMMARY OF THE INVENTION

Accordingly, it is an object of the present invention is to provide a via-hole processing method that effectively forms a via-hole reaching a bonding pad in a substrate of a wafer without boring a hole in the bonding pad.

In accordance with an aspect of the present invention, there is provided a via-hole formation method of forming a via-hole reaching a bonding pad, in a substrate of a wafer in which a plurality of devices are formed on a surface of the substrate and the bonding pad is formed on each of the devices, the via-hole formation method comprising the step of: irradiating a pulse laser beam whose energy distribution is shaped into a top-hat shape to the rear surface side of the substrate to form a via-hole reaching the bonding pad.

Preferably, energy density per pulse of the pulse laser beam is set to 18 to 30 J/cm$^2$.

In the via-hole formation method according to the present invention, the pulse laser beam shaped in energy distribution into a top-hat shape is applied to the rear surface side of the substrate to form the via-hole reaching the bonding pad. Since the energy distribution of the leading end of the pulse laser beam is uniform, the bonding pad is not processed to otherwise get a hole but a laser processing hole reaching the bonding pad can be formed in the substrate of the wafer.

If the pulse laser beam whose energy distribution is the Gaussian distribution is used, an energy density per pulse of 30 J/cm$^2$ or more is needed to form a via-hole in the substrate 21 of the semiconductor made of silicon. However, if the energy distribution of the pulse laser beam is shaped into the top-hat shape like the present invention, it is possible to form the via-hole in the substrate of the semiconductor wafer made of silicon at an energy density per pulse of 18 J/cm$^2$ or more, thereby enhancing energy efficiency.

Further, if the pulse laser beam whose energy distribution is the Gaussian distribution is used, the energy expanding on the skirt, namely, on the outer circumference of the energy distribution processes the outer circumference of the via-hole. Thus, it is difficult to form the via-hole according to the design specifications. However, if the energy distribution of the pulse laser beam is shaped into the top-hat shape like the present invention, the energy expanding on the skirt, namely, on the outer circumference of the energy distribution is aggregated. Consequently, the via-hole according to the design specifications can be formed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBIDIMENTS

Figure 1:
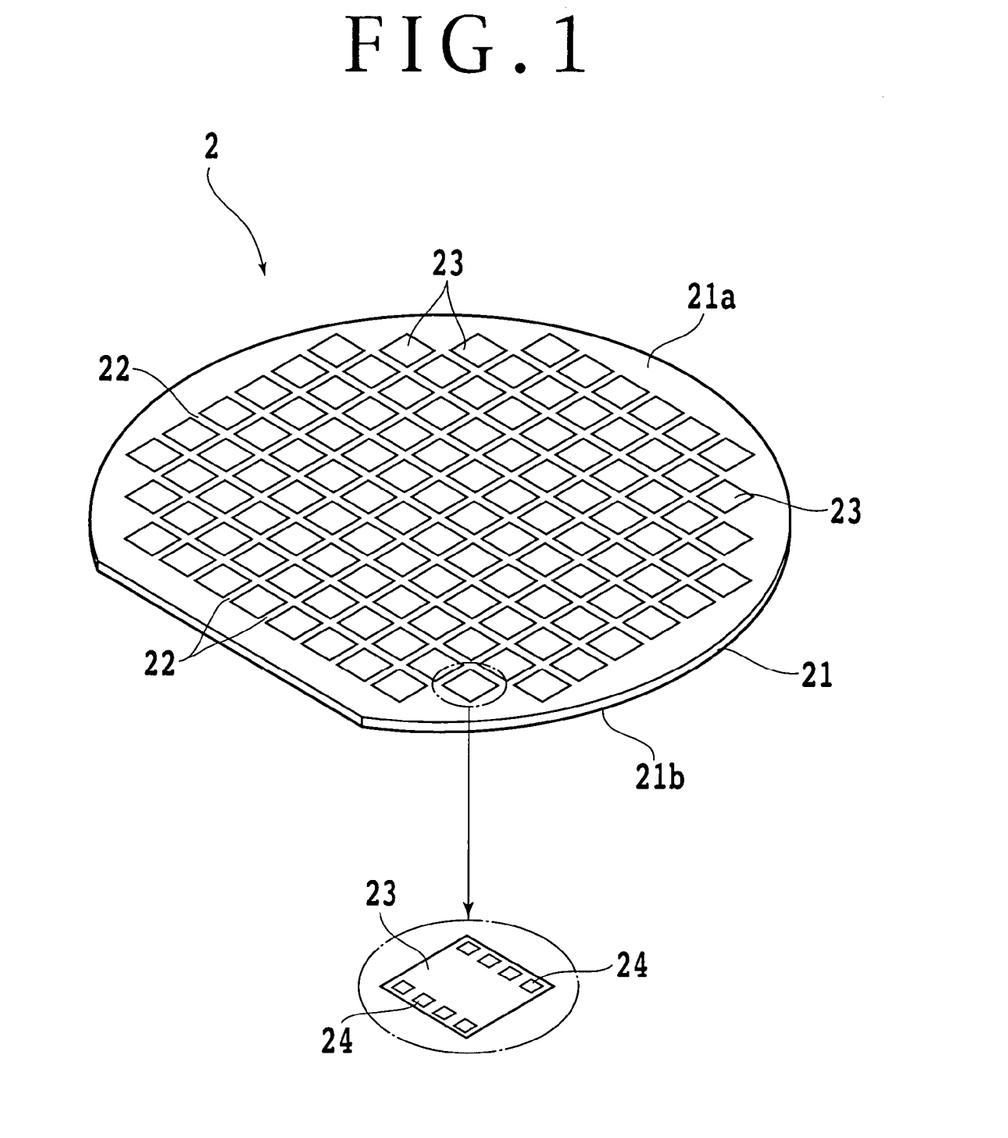
FIG. 1 is a perspective view of a semiconductor wafer processed by a via-hole processing method according to the present invention.

A via-hole processing method according to the present invention will hereinafter be described with reference to the accompanying drawings. FIG. 1 is a perspective view of a semiconductor wafer 2 as a wafer processed by a via-hole processing method of the present invention. The semiconductor wafer 2 shown in FIG. 1 is sectioned into a plurality of regions by a plurality of streets arranged in a lattice-like manner on a front surface 21a of a substrate 21 and devices such as ICs, LSIs or the like are formed on the respective regions. All the devices have the same configuration. The substrate 21 is formed of silicon so as to have a thickness of e.g. 100 μm. A plurality of bonding pads 24 are formed on the surface of each device 23. The bonding pad is made of aluminum, copper, gold, platinum, nickel or other materials so as to have a thickness of 5 μm.

Figure 2:
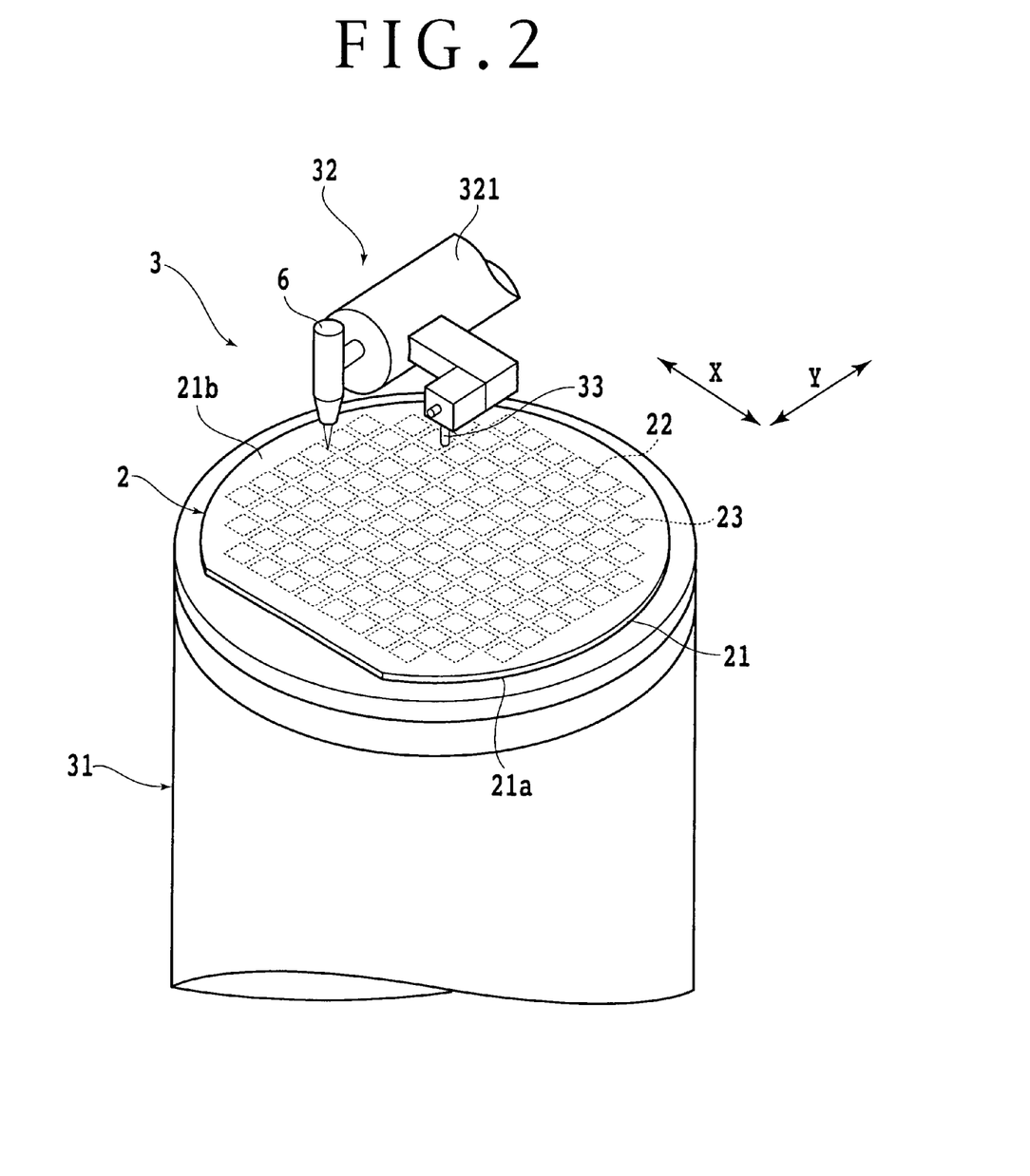
FIG. 2 is a perspective view of an essential portion of a laser processing machine according to the present invention.

The semiconductor wafer 2 is irradiated with a pulse laser beam from the rear surface 21b of the substrate 21 to be bored with via-holes each reaching the bonding pad 24. A laser processing machine 3 shown in FIG. 2 is used to bore the via-holes in the substrate 21 of the semiconductor wafer 2. The laser processing machine 3 includes a chuck table 31 to hold a workpiece and a laser beam irradiation device 32 to emit a laser beam to the workpiece held on the chuck table 31. The chuck table 31 is configured to suck and hold the workpiece. In addition, the chuck table 31 is moved in a process-transfer direction indicated with arrow X in FIG. 2 by a process-transfer mechanism not shown and moved in a dividing-transfer direction indicated with arrow Y by a dividing-transfer mechanism not shown.

The laser beam irradiation device 32 is disposed in a cylindrical casing 321 which is substantially arranged in a horizontal manner. The laser beam irradiation device 32 is described with reference to FIG. 3. The laser beam irradiation device 32 includes a pulse laser beam oscillation device 4, a power controller 5, a concentrator or condenser 6, a beam deflector 7, a laser beam-shaping device 8, and a collimation lens 9. The concentrator 6 concentrates a pulse laser beam that is oscillated by the pulse laser beam oscillation device 4 and power-controlled by the power controller 5. The beam deflector 7 is interposed between the power-controller 5 and the concentrator 6 and deflects the laser beam oscillated by the laser beam oscillation device 4. The laser beam-shaping device 8 is interposed between the power controller 5 and the beam deflector 7. The collimation lens 9 is disposed between the laser beam-shaping device 8 and the beam deflector 7.

Figure 3:
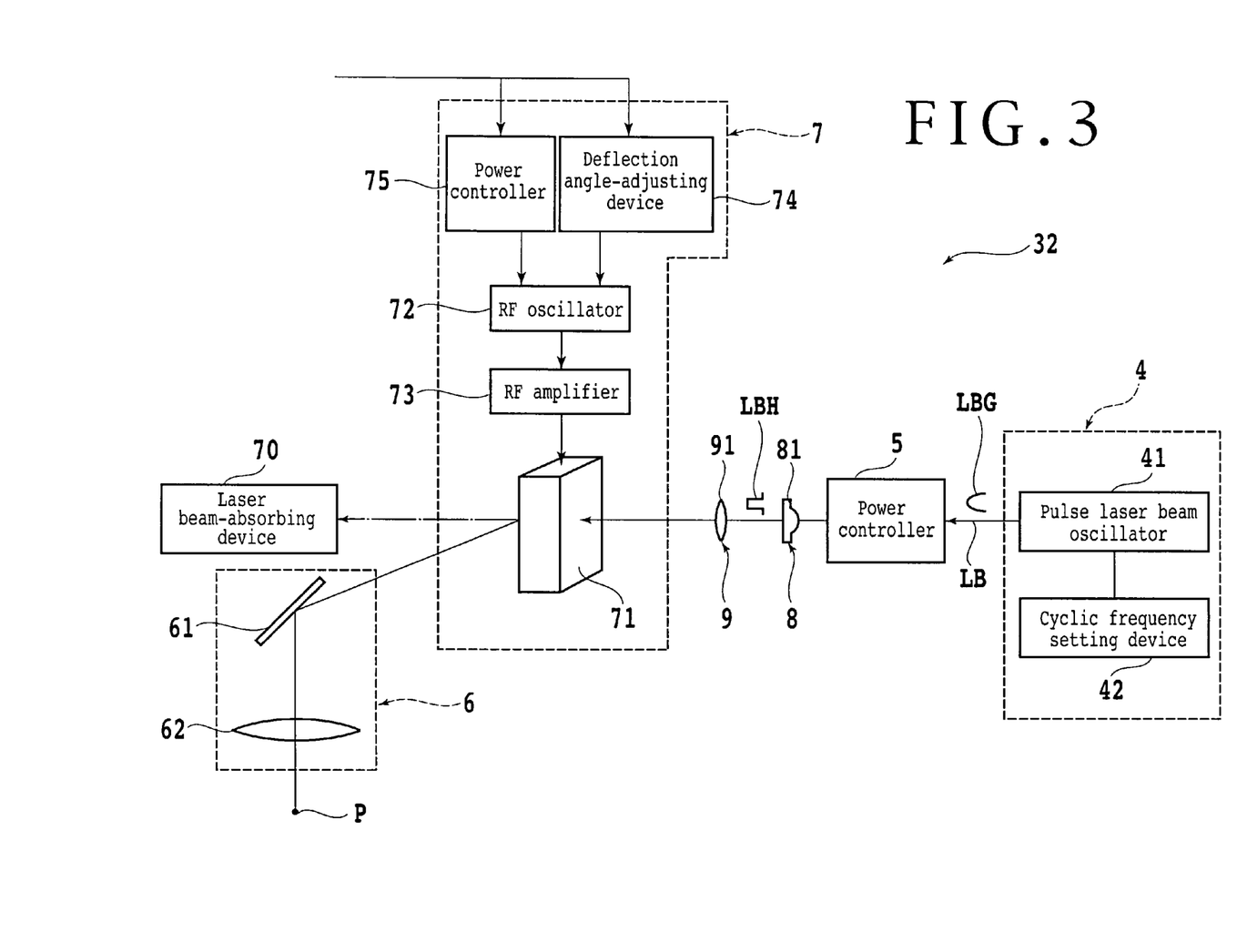
FIG. 3 is a block diagram of a laser beam irradiation device equipped for the laser processing machine shown in FIG. 2.

The pulse laser beam oscillation device 4 includes a pulse laser beam oscillator 41 and a cyclic frequency setting device 42 attached to the oscillator 41. The pulse laser beam oscillator 41 is an YVO4 laser or YAG laser oscillator in the embodiment shown in the FIG. and oscillates a pulse laser beam LB of a wavelength (e.g. 355 nm) with absorbability for the workpiece made of such as silicon or the like. The cyclic frequency setting device 42 sets the frequency of the pulse laser oscillated from the pulse laser beam oscillator 41. The energy distribution of the pulse laser beam LB oscillated from the pulse laser beam oscillation device 4 thus configured is Gaussian distribution LBG. The power controller 5 controls the pulse laser beam LB oscillated from the pulse laser beam oscillation device 4 to predetermined power.

The concentrator 6 includes a direction-changing mirror 61 which changes the direction of the pulse laser beam LB downward; and a collecting lens 62 which collects the laser beam changed in direction by the direction-changing mirror 61, and is attached to the end of the casing 321 as shown in FIG. 2.

The beam deflector 7 is composed of an acoustooptic deflector in the embodiment shown in FIG. 3, which includes an acoustooptic element 71, an RF oscillator 72, an RF amplifier 73, a deflection angle-adjusting device 74 and a power controller 75. The acoustooptic deflector 71 deflects the laser beam oscillated by the laser beam oscillation device 4. The RF oscillator 72 creates an RF (radio frequency) applied to the acoustooptic deflector 71. The RF amplifier 73 amplifies the power of the RF created by the RF oscillator 72 and applies it to the acoustooptic element 71. The deflection angle-adjusting device adjusts the radio frequency created by the RF oscillator 72. The power-adjusting device 75 adjusts the amplitude of the radio frequency created by the RF oscillator 72. The acoustooptic element 71 can adjust the deflection angle of the laser beam in response to the applied radio frequency as well as the power of the laser beam in response to the amplitude of the applied radio frequency. Incidentally, the deflection angle-adjusting device 74 and the power-adjusting device 75 are controlled by a controller not shown.

The beam deflector 7 which is the acoustooptic deflection device in the embodiment shown in the figure is configured as described above and its operation is described below. For example, a voltage of 10 V is applied to the deflection angle-adjusting device 74 of the acoustooptic device 7 and the radio frequency corresponding to 10 V is applied to the acoustooptic element 71. In this case, the pulse laser beam oscillated from the pulse laser beam oscillation device 4 is deflected as shown with a solid line in FIG. 3 and concentrated at a concentration point P. For example, a voltage of 0 V is applied to the deflection angle-adjusting device 74 of the acoustooptic device 7 and the radio frequency corresponding to 0 V is applied to the acoustooptic element 71. In this case, the pulse laser beam oscillated from the pulse laser beam oscillation device 4 is directed to a laser beam-absorbing device 70 as shown with a broken line in FIG. 3.

While the acoustooptic deflector is explanatorily used as the beam deflector 7 which deflects the laser beam oscillated by the laser beam oscillation device 4, a galvano-scanner may be used as the beam deflector. The galvano-scanner includes a pair of mirrors which are spaced apart from each other at a given interval so as to be opposite and parallel to each other; and an angle-adjusting actuator which adjust the installation angle of the pair of mirrors. An aspheric lens 81 is used as the laser beam-shaping device 8 in the embodiment shown in FIG. 3. The aspheric lens 81 shapes the energy distribution of the pulse laser beam LB oscillated from the pulse laser beam oscillation device 4 into a top-hat shape LBH from the Gaussian distribution LBG.

A convex lens 91 is used as the collimation lens 9 in the embodiment shown in FIG. 3. The convex lens 91 is disposed so that its focal position is positioned at the focal position of the aspheric lens 81. More specifically, referring to FIG. 4, if the focal distance (f1) of the aspheric lens 81 is 40 mm and the focal lens (f2) of the convex lens 91 is 40 mm, the convex lens 91 is located at a position spaced apart at a distance (d1) of 80 mm from the aspheric lens 81. In this way, the focal distance (f1) of the aspheric lens 81 and the focal distance of the convex lens 91, and the distance (d1) between the aspheric lens 81 and the convex lens 91 are set, whereby a combination lens consisting of the aspheric lens 81 and the convex lens 91 can have an infinite focal distance. Thus, the laser beam shaped by the aspheric lens 81 as the laser beam-shaping device 81 is modified into the collimated laser beam by the convex lens 91.

Figure 5:
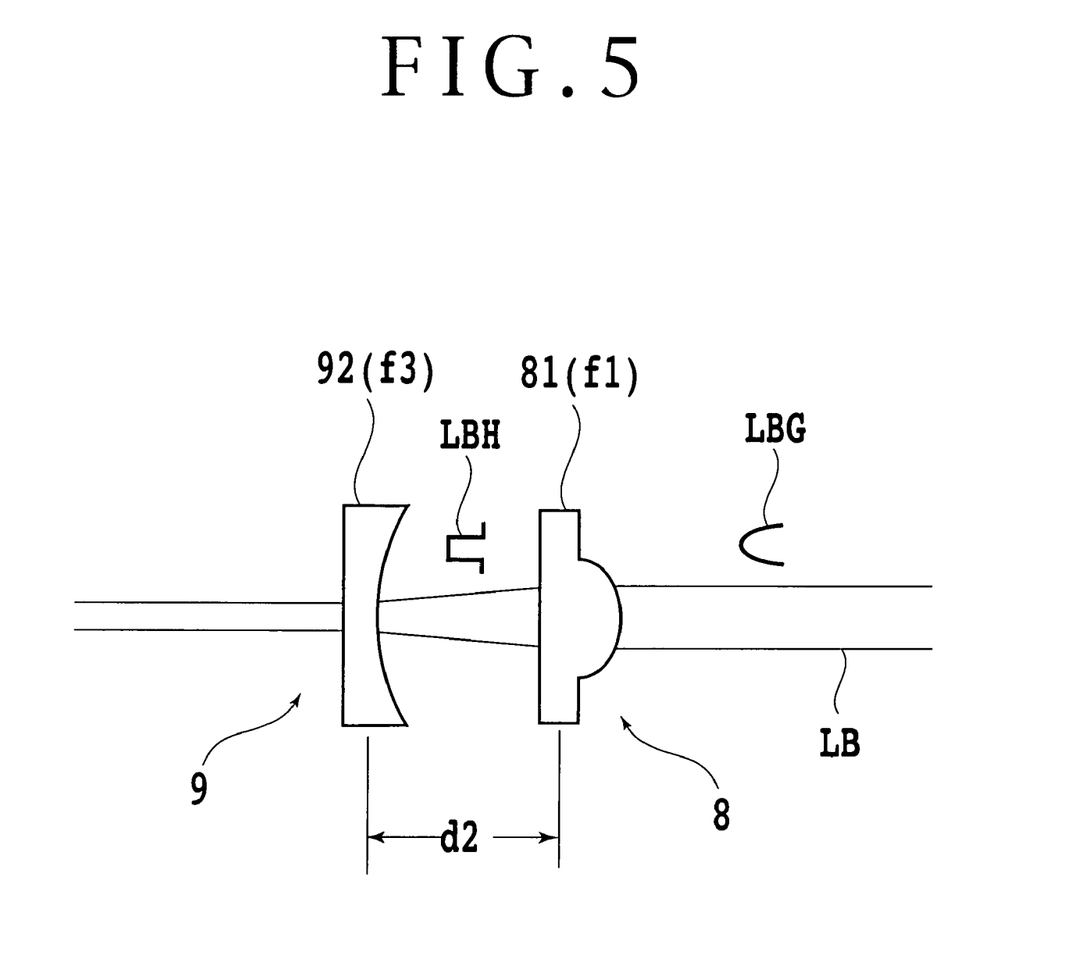
FIG. 5 is an explanatory diagram illustrating a second embodiment of a laser beam-shaping device and a collimation lens constituting the laser beam irradiation device shown in FIG. 2.

A description is next made of an embodiment in which a concave lens 92 is used as the collimation lens 9 with reference to FIG. 5. In the case where the concave lens 92 is used as the collimation lens 9, if the focal length (f1) of the aspheric lens 81 is 40 mm and the focal distance (f3) of the concave lens 92 is −30 mm, the concave lens 92 is disposed at a position spaced apart at a distance (d2) of 10 mm from the aspheric lens 81. In this way, the focal distance (f1) of the aspheric lens 81 and the focal distance (f3) of the concave lens 92, and the distance (d2) between the aspheric lens 81 and the concave lens 92 are set, whereby a combination lens consisting of the aspheric lens 81 and the concave lens 92 can have an infinite focal distance. Thus, the laser beam shaped by the aspheric lens 81 as the laser beam-shaping device 81 is modified into collimated laser beams by the concave lens 92. Incidentally, if the convex lens 92 is used as the collimation lens 9, the distance between the aspheric lens 81 and the concave lens 92 can be reduced.

Figure 6:
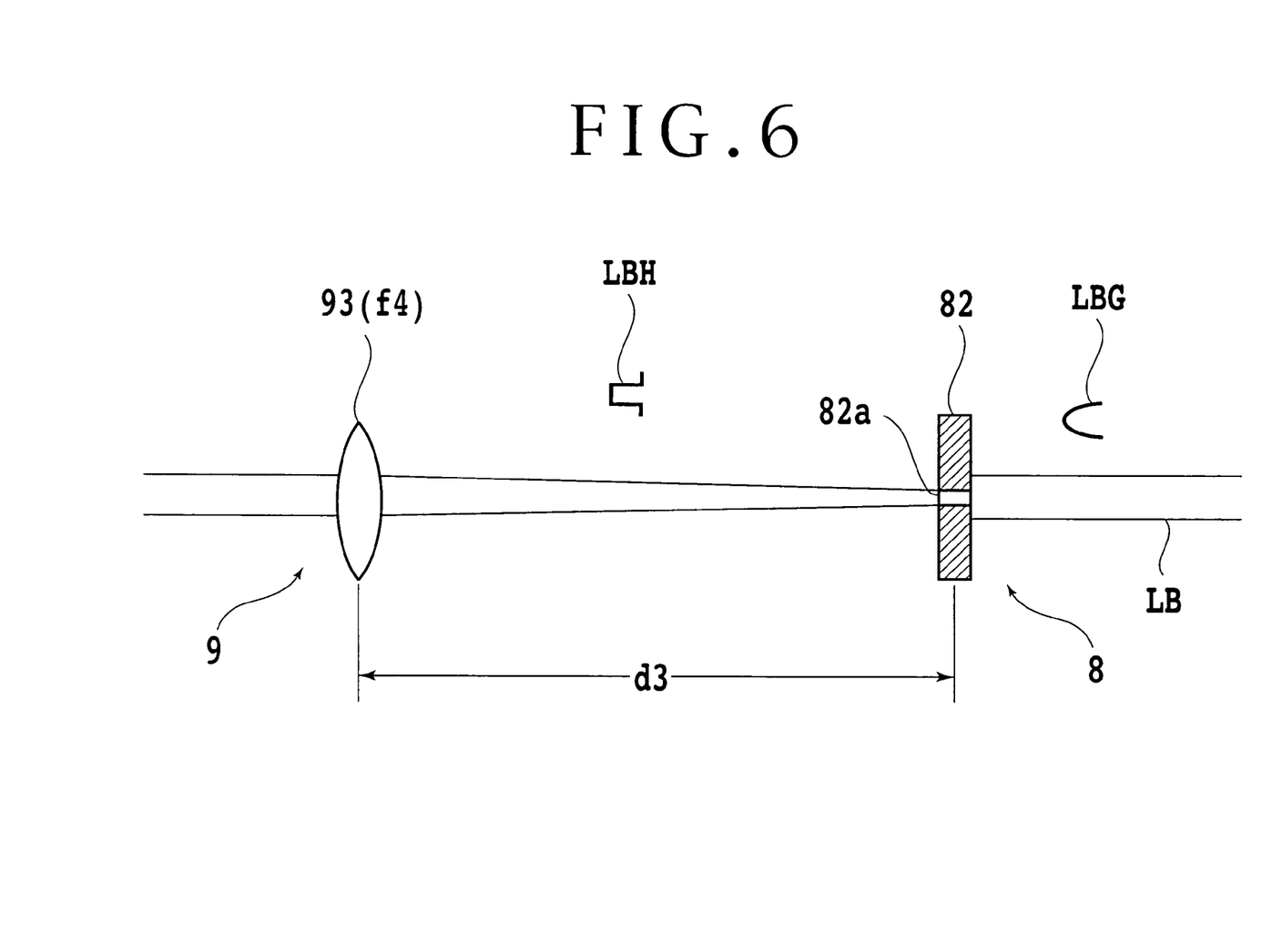
FIG. 6 is an explanatory diagram illustrating a third embodiment of a laser beam-shaping device and a collimation lens constituting the laser beam irradiation device shown in FIG. 2.

Another embodiment of the laser beam-shaping device 8 is next described with reference to FIG. 6. The laser beam-shaping device 8 shown in FIG. 6 uses a mask 82 provided with an aperture 82a having a diameter of 500 μm. Thus, the use of the mask 82 provided with the aperture 82a having a diameter of 500 μm can allow only the central portion of the pulse laser beam LB oscillated from the pulse laser beam oscillation device 4 to pass through the aperture 82a, shaping the energy distribution into a top-hat shape. The convex lens 93 as the collimation lens 9 is disposed so that the focal position of the convex lens 93 is positioned at the hole 82a of the mask 82. Specifically, if the focal distance (f4) of the convex lens 93 is 500 mm, the convex lens 93 is disposed at a position spaced apart at a distance (d3) of 500 mm from the mask 82. In this way, the convex lens 93 as the collimation lens 9 is disposed so that the focal position of the convex lens 93 is position at the aperture 82a of the mask 82. Thus, the laser beam that has passed through the aperture 82a of the mask 82 is modified into the collimated laser beam by the convex lens 93. Incidentally, in the embodiment shown FIG. 6, if the focal distance of the collecting lens 62 included in the concentrator 6 is (f5), the size of an image concentrated by the collecting lens 62 is (f5/f4).

Figure 7:
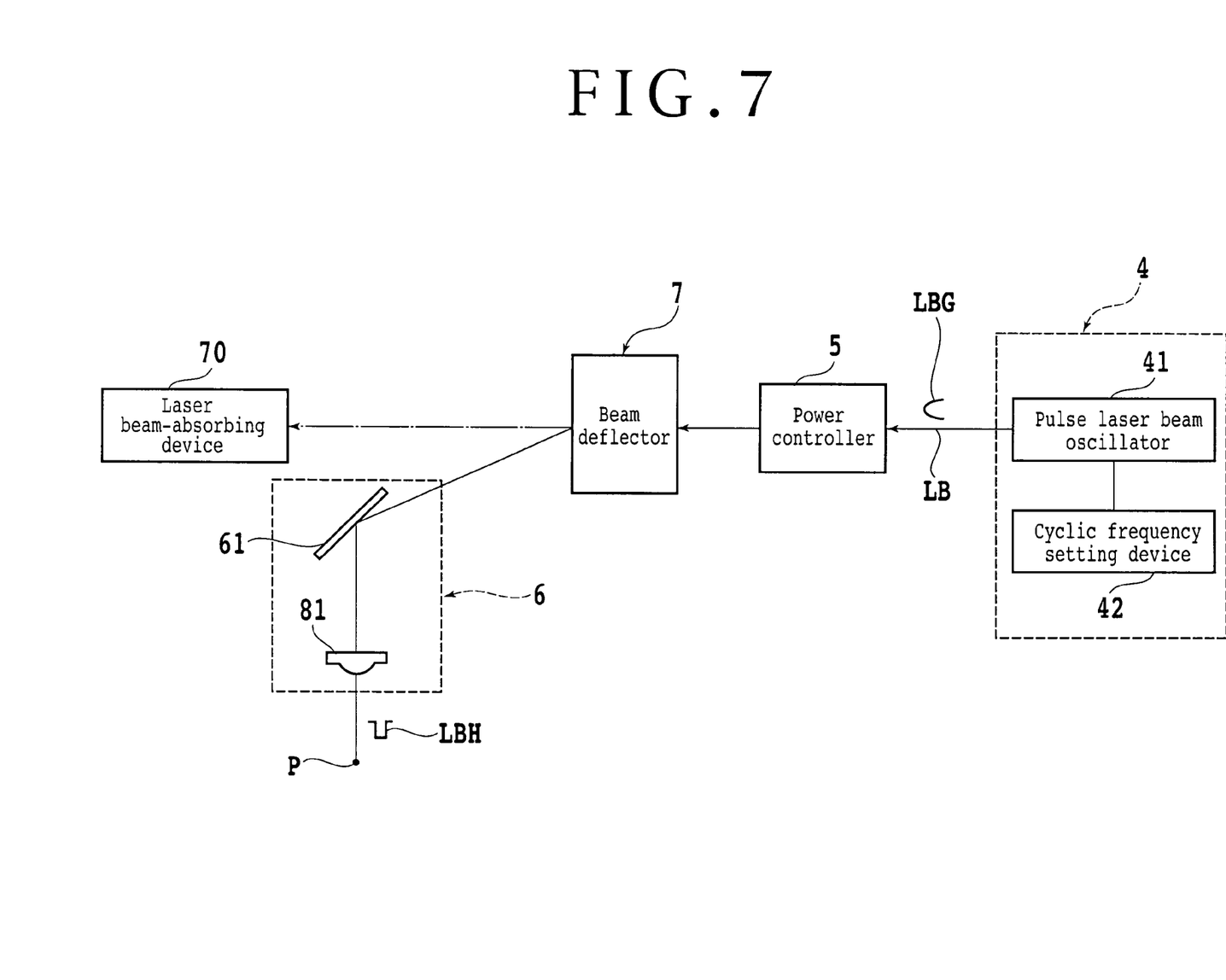
FIG. 7 is an explanatory diagram illustrating another embodiment of a laser beam-shaping device constituting the laser beam irradiation means shown in FIG. 2.

Further another embodiment of the laser beam-shaping device 8 is next described with reference to FIG. 7. In the embodiment of FIG. 7, an aspheric lens 81 as the laser beam-shaping device 8 mentioned above is used as a collecting lens of the concentrator 6 described above by way of example. The embodiment of FIG. 7 can eliminate the collimation lens 9 mentioned above. Incidentally, the other configurations of the embodiment in FIG. 7 are the same as those shown FIG. 3 and therefore, like or corresponding members are denoted with like reference numerals and their explanations are omitted. In the embodiment shown in FIG. 7, a laser beam LB oscillated by the pulse laser beam oscillation device 4 to have the Gaussian distribution as energy distribution is concentrated in such a manner that the energy distribution is shaped into a top-hat shape by the aspheric lens 81 disposed in the concentrator 6.

Referring again to FIG. 2, the laser processing machine 3 includes an imaging device 33 attached to the leading end portion of the casing 321 constituting part of the laser beam irradiation device 32. The imaging device 33 includes, in addition to a usual imaging element (CCD) which captures images with visible light, an infrared illumination device which emits infrared light to the workpiece; an optical system which captures the infrared light emitted by the infrared illumination device; and an imaging element (infrared light CCD) which outputs an electric signal corresponding to the infrared light captured by the optical system. The imaging device sends the signals of images captured to a controller not shown.

Figure 4:
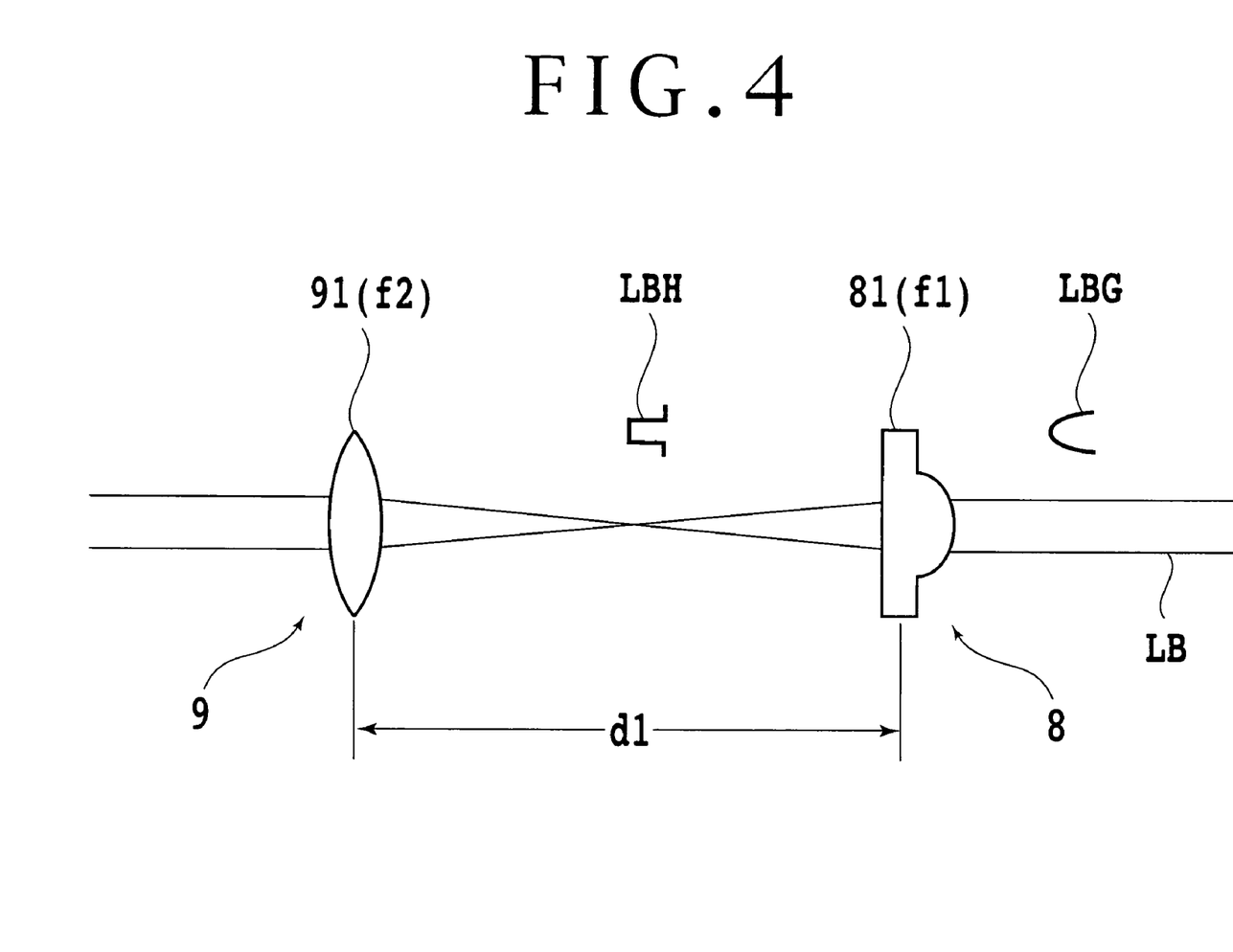
FIG. 4 is an explanatory diagram illustrating a first embodiment of a laser beam-shaping device and a collimation lens constituting the laser beam irradiation device shown in FIG. 2.

A description is hereinafter made of the via-hole processing method of forming a via-hole reaching the bonding pad 24 in the substrate 21 of the semiconductor wafer 2 shown in FIG. 1 by use of the laser processing machine 3 shown in FIGS. 2 through 4. As shown in FIG. 2, the semiconductor wafer 2 is placed on the chuck table 31 of the laser processing machine 3 with its front surface 2a down and sucked and held on the chuck table 31. Thus, the semiconductor wafer 2 is held with its rear surface 21b up.

The chuck table 31 which sucks and holds the semiconductor wafer 2 as described above is positioned right below the imaging device 33 by the process-transfer mechanism not shown. If the chuck table 31 is positioned right below the imaging device 33, the semiconductor wafer 2 on the chuck table 31 is positioned at a predetermined coordinate position. In this state, alignment operation is performed to check whether or not the streets 22 formed in a lattice-like manner in the semiconductor wafer 2 held by the chuck table 31 are parallel to the X-direction and to the Y-direction. More specifically, the alignment operation is performed such that the semiconductor wafer 2 held by the chuck table 31 is imaged by the imaging device 33 and image-processing such as pattern matching and the like is executed. In this case, the front surface 21a of the substrate 21 formed with the streets 22 of the semiconductor wafer 2 is located on the lower side. As described above the imaging device 33 is configured to include the infrared illumination device, the optical system which captures infrared light, and the imaging element (infrared light CCD) which outputs an electric signal corresponding to the infrared light. Thus, the imaging device 33 can image the streets 22 through the rear surface 21b of the substrate 21.

The execution of the alignment operation described above positions the semiconductor wafer 2 held on the chuck table 31 at the predetermined coordinate position. It is to be noted that a plurality of the bonding pads 24 formed on the device 23 formed on the front surface 21a of the substrate 21 included in the semiconductor wafer 2 have designed coordinate positions which are preliminarily stored in the controller not shown of the laser processing device 3.

Figure 8:
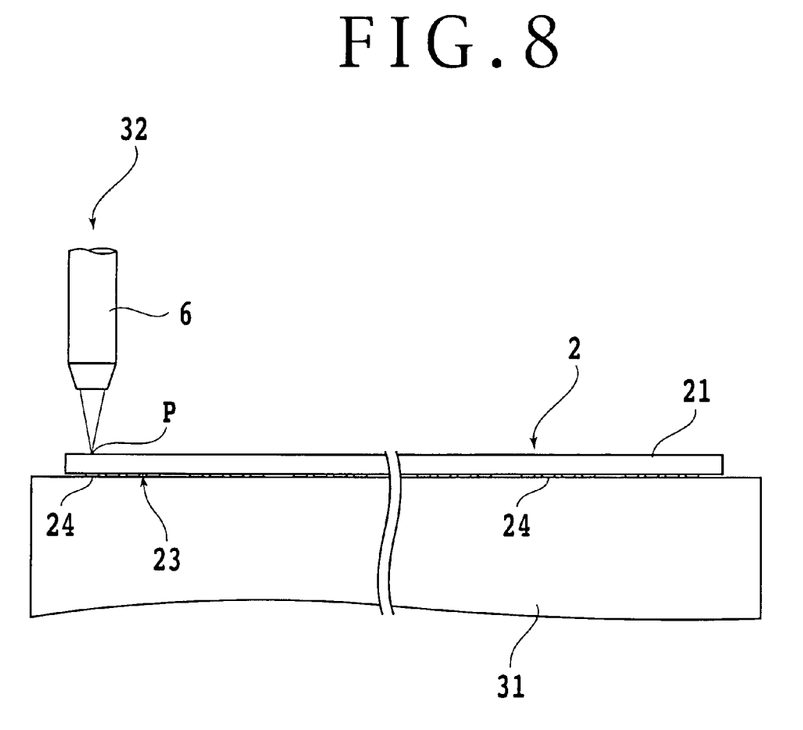
FIG. 8 is an explanatory diagram of a via-hole formation process in the via-hole processing method according to the present invention.

Referring to FIG. 8, after the alignment operation described above, the chuck table 31 is moved so that the leftmost device 23 of the plurality of devices 23 formed, in the predetermined direction, on the substrate 21 of the semiconductor wafer 2 is positioned right below the concentrator 6. The leftmost bonding pad 24 of the plurality of bonding pads 24 formed in the leftmost device 23 in FIG. 8 is positioned right below the concentrator 6.

A via-hole formation process is next performed. In this process, the laser beam irradiation device 32 is actuated to emit a laser beam from the concentrator 6 to the rear surface 21b of the substrate 21. Thus, a via-hole is formed in the substrate 21 to extend from the rear surface 21b thereof to the bonding pad 24. In this case, the spot S of the pulse laser beam is allowed to coincide with the vicinity of the rear surface (upper surface) 21b of the substrate 21. Preferably, the laser beam to be emitted has a wavelength (e.g. 355 nm) having absorbability for the substrate 21 made of silicon. In addition, the laser beam has an energy density per pulse of 18 through 30 J/cm² so that the substrate 2 made of silicon is subjected to an ablation process but the bonding pad 24 made of metal is not subjected to the ablation process.

The processing conditions for the above-mentioned via-hole formation process are described by way of example.

| Light source | LD excitation Q switch Nd: YVO4 |
|---|---|
| Wavelength | 355 nm |
| Cyclic frequency | 10 kHz |
| Energy density per pulse | 20 J/cm² |
| Spot diameter | φ 70 μm |

Figure 9:
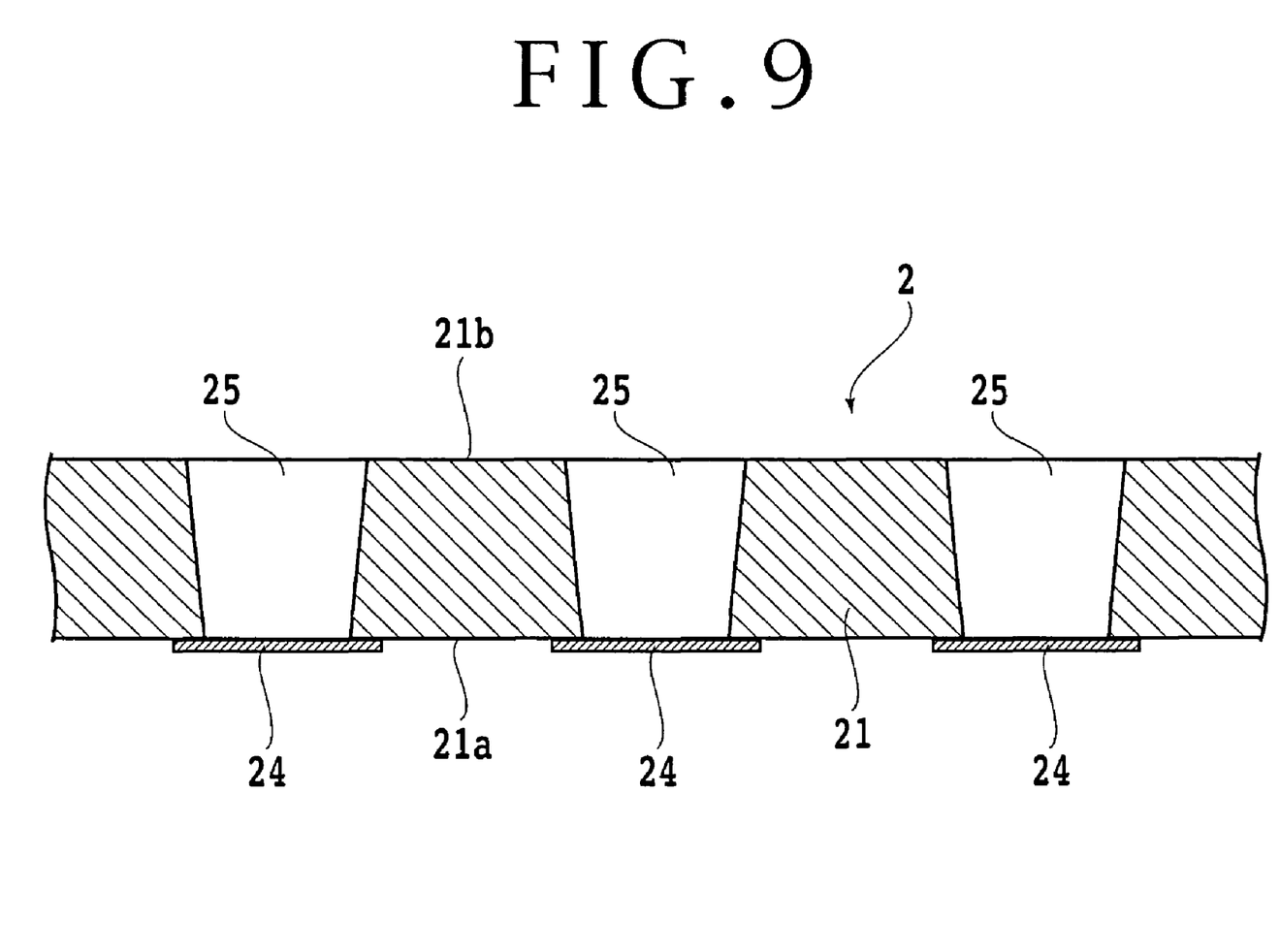
FIG. 9 is a partially enlarged cross-sectional view of a semiconductor wafer formed with a via-hole by executing the via-hole formation process in the present invention.

If the via-hole formation process is performed under such conditions, the pulse laser beam can form a hole having a depth of 5 μm by one pulse. Accordingly, if the substrate 21 has a thickness of 100 μm, the pulse laser beam is emitted by 20 pulses to form the via-hole 25 that extends from the rear surface 21b to the front surface 21a of the substrate 21, namely, to the bonding pad 24. Incidentally, when the pulse laser beam is emitted to the substrate of the semiconductor wafer 2 by predetermined pulses in the via-hole formation process, a voltage of e.g. 10 V is applied to the deflection angle-adjusting device 74 of the acoustooptic deflector 7 and the radio frequency corresponding to 10 V is applied to the acoustooptic element 71. Thus, the pulse laser beam oscillated by the pulse laser beam oscillation device 4 is directed to the concentrator 6 as shown with a solid line in FIG. 3. On the other hand, when the pulse laser beam is emitted to the substrate of the semiconductor wafer 2 by predetermined pulses, a voltage of e.g. 0 V is applied to the deflection angle-adjusting device 74 of the acoustooptic deflector 7 and the radio frequency corresponding to 0 V is applied to the acoustooptic element 71. Thus, the pulse laser beam oscillated by the pulse laser beam oscillation device 4 is directed to the laser beam-absorbing device 70 as shown with a broken line in FIG. 3.

The pulse laser beam directed to the substrate 21 of the semiconductor wafer 2 is shaped in energy distribution into a top-hat shape in the via-hole formation process described above. Since the leading end of the energy distribution is uniform, the bonding pad 24 is not processed, that is, is not bored with a hole and the via-hole 25 reaching the bonding pad 24 can be formed in the substrate of the wafer.

If the pulse laser beam is used in which its energy distribution is Gaussian distribution, an energy density per pulse of 30 J/cm² or more is needed to form a via-hole in the substrate 21 of the semiconductor made of silicon. However, if the energy distribution of the pulse laser beam is shaped into the top-hat shape like the present invention, it is possible to form the via-hole in the substrate 21 of the semiconductor wafer 2 made of silicon at an energy density per pulse of 18 J/cm² or more, thereby enhancing energy efficiency. The use of the pulse laser beam whose energy distribution is shaped into the top-hat shape can reduce the number of pulses to be emitted as compared with the case where the pulse laser beam whose energy distribution is the Gaussian distribution is used if the energy density per pulse is the same. In addition, if the number of pulses to be emitted is the same, the energy density per pulse can be reduced.

Further, if the pulse laser beam whose energy distribution is the Gaussian distribution is used, the energy expanding on the skirt, namely, the outer circumference of the Gaussian distribution processes the outer circumference of the via-hole. Thus, it is difficult to form the via-hole according to the design specifications. However, if the energy distribution of the pulse laser beam is shaped into the top-hat shape like the present invention, the energy expanding on the skirt, namely, the outer circumference of the energy distribution is aggregated. Consequently, the via-hole according to the design specifications can be formed.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A via-hole formation method of forming a via-hole reaching a bonding pad, in a substrate of a wafer in which a plurality of devices are formed on a surface of the substrate and the bonding pad is formed on each of the devices, the via-hole formation method comprising the step of:
   irradiating a pulse laser beam whose energy distribution is shaped into a top-hat shape to the rear surface side of the substrate to form a via-hole reaching the bonding pad.

2. The via-hole formation method according to claim 1, wherein energy density per pulse of the pulse laser beam is set to 18 to 30 J/cm².

* * * * *